(12) United States Patent
Liaw

(10) Patent No.: US 7,577,040 B2
(45) Date of Patent: Aug. 18, 2009

(54) DUAL PORT MEMORY DEVICE WITH REDUCED COUPLING EFFECT

(75) Inventor: Jhon Jhy Liaw, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 443 days.

(21) Appl. No.: 11/488,501

(22) Filed: Jul. 18, 2006

(65) Prior Publication Data

US 2008/0019171 A1 Jan. 24, 2008

(51) Int. Cl.
*G11C 16/04* (2006.01)
(52) U.S. Cl. .................. 365/189.05; 257/E27.098; 257/369
(58) Field of Classification Search ........... 365/189.05; 257/E27.098–E27.099
See application file for complete search history.

(56) References Cited

U.S. PATENT DOCUMENTS

| | | | | |
|---|---|---|---|---|
| 5,966,317 A | * | 10/1999 | O'Connor | 365/53 |
| 6,118,708 A | * | 9/2000 | Yoshida et al. | 365/190 |
| 7,092,279 B1 | * | 8/2006 | Sheppard | 365/154 |
| 7,365,432 B2 | * | 4/2008 | Liaw | 257/758 |
| 2002/0100920 A1 | * | 8/2002 | Yamauchi et al. | 257/200 |
| 2005/0121810 A1 | * | 6/2005 | Mali et al. | 257/903 |
| 2005/0247981 A1 | | 11/2005 | Wang | 257/369 |
| 2005/0253287 A1 | * | 11/2005 | Liaw | 257/903 |
| 2006/0291274 A1 | * | 12/2006 | Uematsu | 365/154 |

OTHER PUBLICATIONS

Koji Nil, et al., A 90nm Dual-Port SRAM with 2.04 µm²8T-Thin Cell Using Dynamically-Controlled Column Bias Scheme, ISSCC 2004/Session 27/SRAM/27.9, 2004 IEEE Int'l Solid-State Circuits Conference.
Chinese Office Action 2007100846852.

* cited by examiner

*Primary Examiner*—Jerome Jackson, Jr.
*Assistant Examiner*—Paul A Budd
(74) *Attorney, Agent, or Firm*—K & L Gates LLP

(57) ABSTRACT

A dual port SRAM cell includes at least one pair of cross-coupled inverters connected between a power line and complementary power line. A number of pass gate transistors connect the cross-coupled inverters to a first bit line, a first complementary bit line, a second bit line, and a second complementary bit line on a first metal layer in the memory device. A first word line is coupled to gates of the first and second pass gate transistors, located on a second metal layer in the memory device. A second word line is coupled to gates of the third and fourth pass gate transistors, located on a third metal layer in the memory device, wherein the first, second and third metal layers are at different levels.

16 Claims, 4 Drawing Sheets

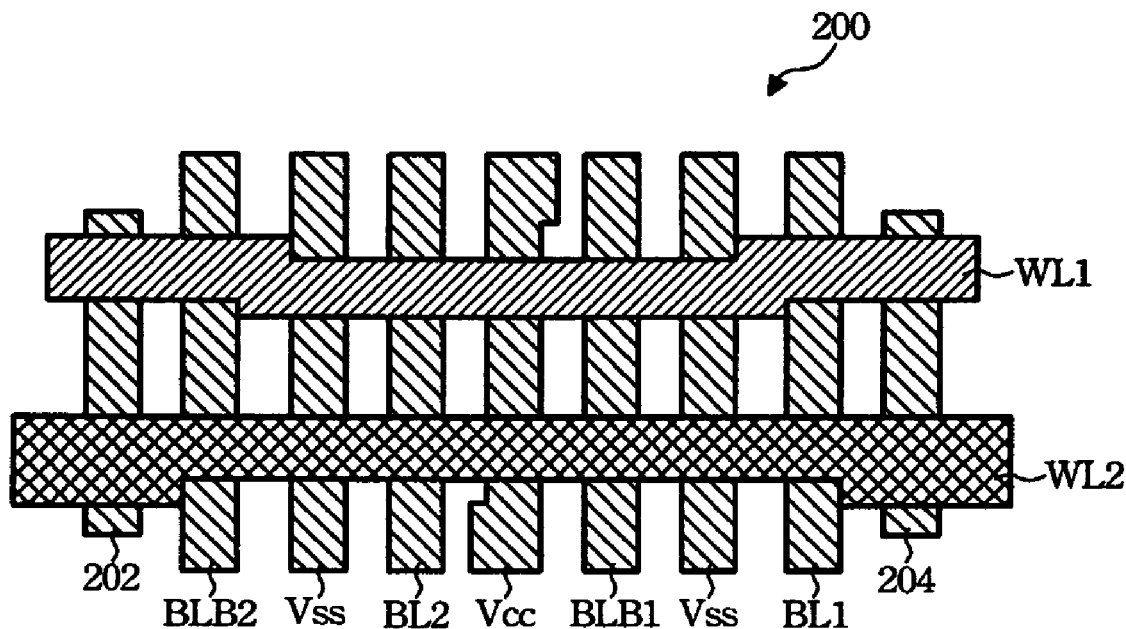
F I G. 2A
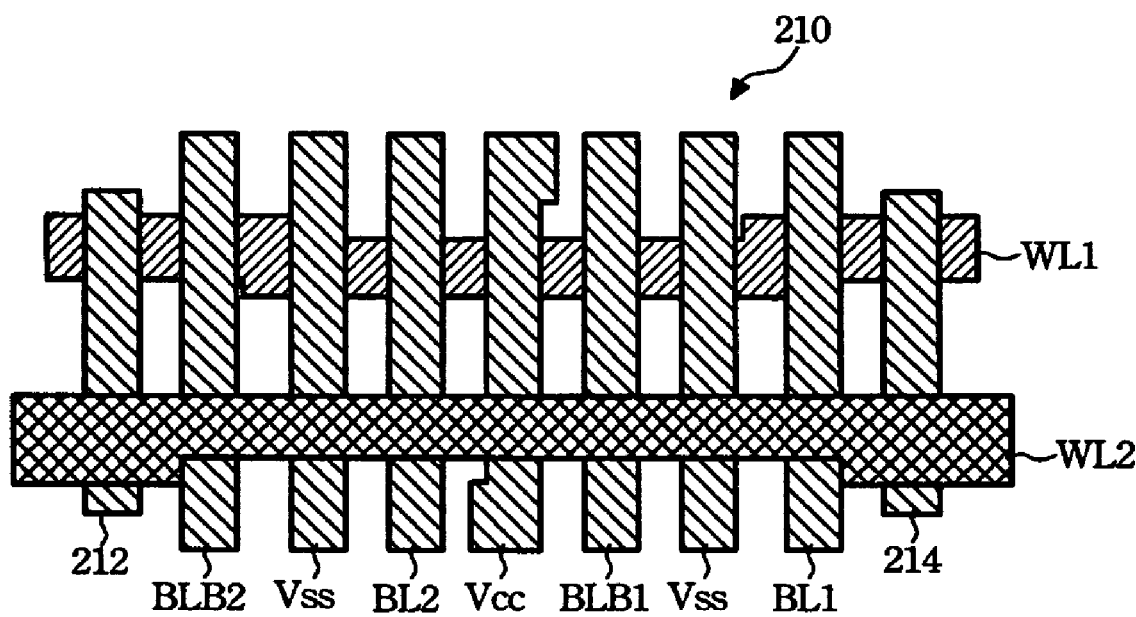
F I G. 2B

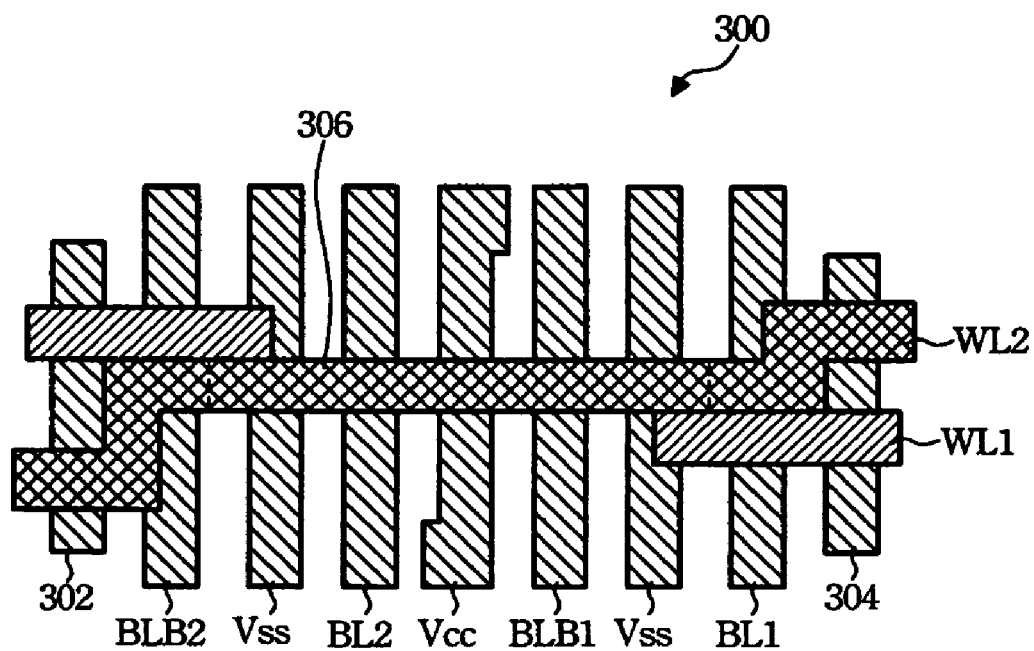
F I G . 3
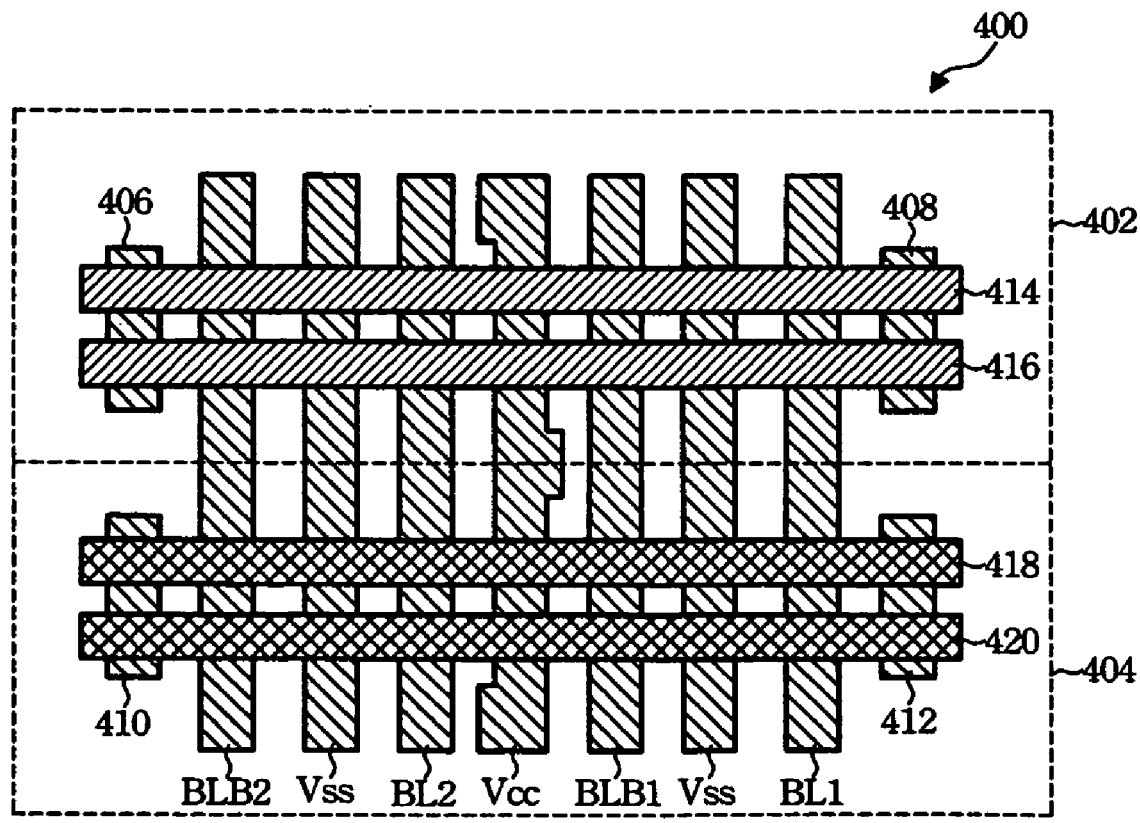
F I G . 4

DUAL PORT MEMORY DEVICE WITH REDUCED COUPLING EFFECT

BACKGROUND

The present invention relates generally to integrated circuit (IC) designs, and more particularly to a dual port memory device with reduced coupling effect.

FIG. 1 schematically illustrates a typical dual port static random access memory (SRAM) cell 100 that is often used in memory devices for electronic products, such as cellular phones, digital cameras, personal digital assistants, and personal computers. The cell 100 includes two cross-coupled inverters 102 and 104. The inverter 102 is comprised of a pull-up p-type metal-oxide-semiconductor (PMOS) transistor 106 and a pull-down n-type metal-oxide-semiconductor (NMOS) transistor 108. The inverter 104 is comprised of a pull-up PMOS transistor 110 and a pull-down NMOS transistor 112. The sources of the PMOS transistors 106 and 110 are coupled to a power supply through a power line Vcc. The sources of the NMOS transistors 108 and 112 are coupled to a ground or a complementary power supply through a complementary power line Vss. The gates of PMOS transistor 106 and NMOS transistors 108 are connected together at a node 114, which is further connected to the drains of PMOS transistor 110 and NMOS transistor 112. The gates of PMOS transistor 110 and NMOS transistor 112 are connected together at node 116, which is further connected to the drains of PMOS transistor 106 and NMOS transistor 108. The cross-coupled first and second inverters 102 and 104 function as a latch that stores a value and its complement at the nodes 114 and 116, respectively.

A first port pass gate transistor 118 is coupled between a first port bit line BL1 and the node 114. Another first port pass gate transistor 120 is coupled between a first port bit line bar BLB1 and the node 116. A second port pass gate transistor 122 is coupled between a second port bit line BL2 and the node 114. A second port pass gate transistor 124 is coupled between a second port bit line bar BLB2 and the node 116. The gates of pass gate transistors 118 and 120 are controlled by a first port word line WL1. The gates of pass gate transistors 122 and 124 are controlled by a second port word line WL2. The first and second port word lines WL1 and WL2 can be separately selected to turn on the pass gate transistors 118/120 or 122/124 for reading or writing a value from or into the node 114 through the bit lines BL1/BLB1 or BL2/BLB2.

Conventionally, the bit lines, BL1, BLB1, BL2, BLB2, word lines WL1, WL2, power line Vcc, and complementary power line Vss are constructed on the same metal layer in an IC chip. These closely placed conductors induce coupling capacitance, which, in turn, reduces operation speed and increases noise for the memory cell 100. The coupling effect becomes more serious when those conductive lines become closer as the semiconductor processing technology advances.

As such, what is needed is a dual port SRAM device with a reduced coupling-effect.

SUMMARY

The present invention discloses a memory device having a plurality of dual port SRAM cells. In one embodiment of the invention, each dual port SRAM cell includes at least one pair of cross-coupled inverters connected between a power line and complementary power line. A first pass gate transistor connects the cross-coupled inverters to a first bit line. A second pass gate transistor connects the cross-coupled inverters to a first complementary bit line. A third pass gate transistor connects the cross-coupled inverters to a second bit line. A fourth pass gate transistor connects the cross-coupled inverters to a second complementary bit line, wherein the first bit line, the first complementary bit line, the second bit line, and the second complementary bit line are located on a first metal layer in the memory device. A first word line is coupled to gates of the first and second pass gate transistors, located on a second metal layer in the memory device. A second word line is coupled to gates of the third and fourth pass gate transistors, located on a third metal layer in the memory device, wherein the first, second and third metal layers are at different levels.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2A illustrates a layout structure of a dual port SRAM cell in accordance with one embodiment of the present invention.

FIG. 2B illustrates an alternative layout structure of a dual port SRAM cell in accordance with the embodiment of the present invention.

FIG. 3 illustrates a layout structure of a dual port SRAM cell in accordance with another embodiment of the present invention.

FIG. 4 illustrates a layout structure of two neighboring dual port SRAM cells in accordance with another embodiment of the present invention.

DESCRIPTION

Figure 1:
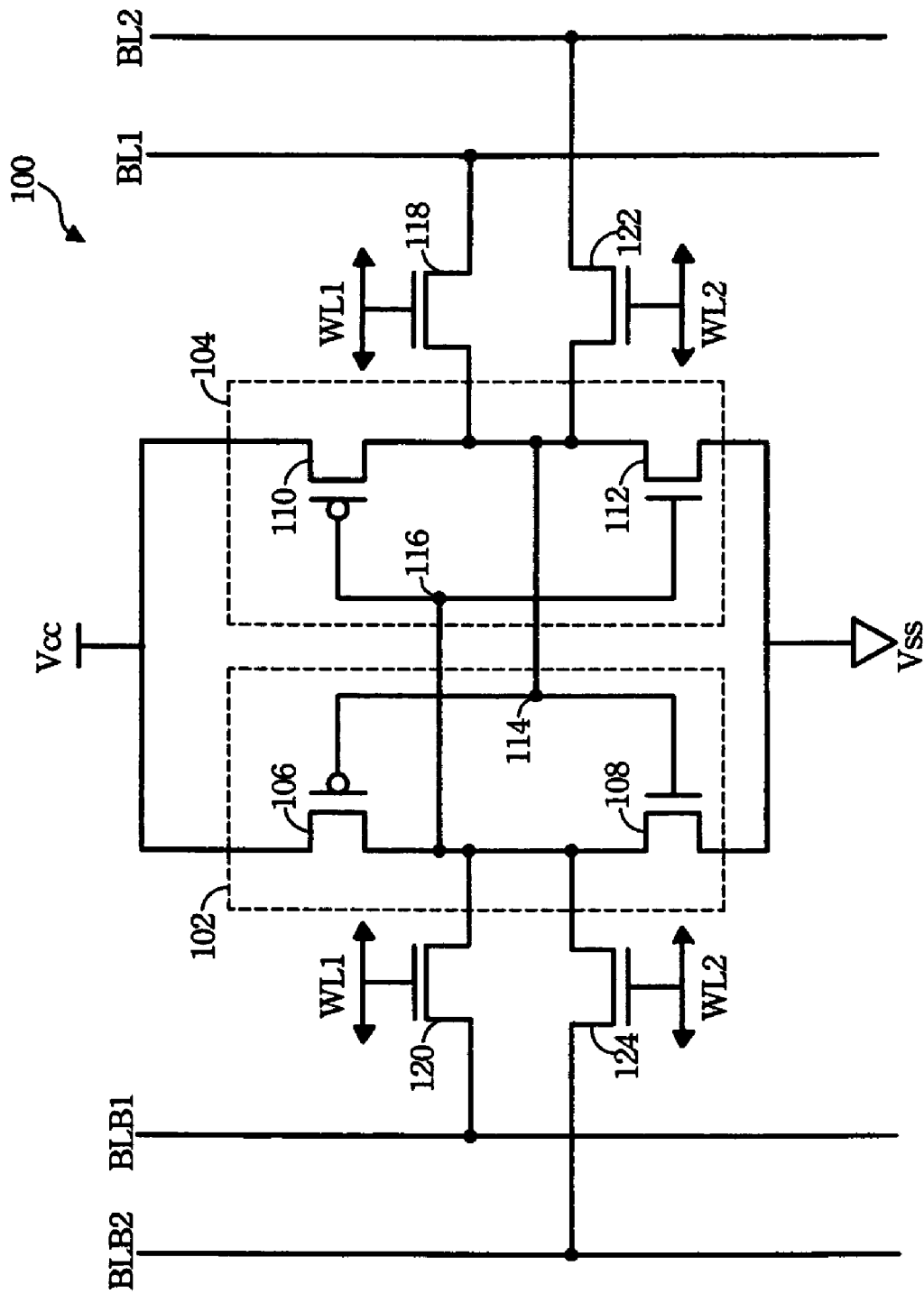
FIG. 1 schematically illustrates a typical dual port SRAM cell.

FIG. 2A illustrates a layout structure 200 of a dual port SRAM cell shown in FIG. 1 in accordance with one embodiment of the present invention. The pull-up transistors 106, 110, pull-down transistors 108, 112, and pass gate transistors 118, 120, 122 and 124 are constructed on a semiconductor substrate, which is not shown in FIG. 2. The first port bit line BL1, first port bit line bar BLB1, second port bit line BL2, second port bit line bar BLB2, power line Vcc and complementary power line Vss are constructed on a first metal layer above the semiconductor substrate. These conductive lines can be connected to various terminals of the transistors on the semiconductor substrate by one or more via contacts (not shown in the figure). One complementary power line Vss is located between the second port bit line bar BLB2 and the second port bit line BL2, and another complementary power line Vss is located between the first port bit line BL1 and the first port bit line bar BLB1. The power line Vcc is located between the second port bit line BL2 and the first port bit line bar BLB1.

The first port word line W1 is constructed on a second metal layer above the first metal layer, on which the bit lines and complementary bit lines are constructed. The second port word line WL2 is constructed on a third metal layer above the second metal layer. The first and second port word lines W1 and W2 can be connected to the gates of pass gate transistors on the semiconductor substrate via the landing pads 202 and 204 on the first metal layer. As understood by people skilled in the art, the conductors on the metal layers are insulated from each other by dielectric materials.

As the first port word line WL1, the second port word line WL2, and the bit lines BL1, BLB1, BL2 and BLB2 are constructed on different metal layers, the bit lines can be made shorter. In this embodiment, the length of each bit line (or bit line bar) can be made smaller than one third of the length of the word line. This helps reduce the coupling effect between the bit lines (including bit line bars). Since the first port word line WL1 and the second port word line WL2 are constructed on different metal layers, the induced capacitance there between can also be reduced. As described above, the power line Vcc and the complementary power line Vss are located between the bit lines BL1, BL2 and the bit line bars BLB1, BLB2. These power line Vcc and complementary power lines Vss function as shields for preventing the bit lines BL1, BL2, and the complementary bit lines BLB1, BLB2 from being affected by induced noise.

FIG. 2B illustrates an alternative layout structure 210 of a dual port SRAM cell in accordance with the embodiment of the present invention. The layout structure 210 is similar to the layout structure 200 in FIG. 2A, except that the bit lines and their complements are constructed on a metal layer between those, on which the first port word line WL1 and the second port word line WL2 are constructed. The first port word line WL1 is located on the first metal layer above the semiconductor substrate on which the transistors are constructed. The landing pads 212, 214, bit lines BL1, BL2, complementary bit lines BLB1, BLB2, power line Vcc, and complementary power lines Vss are constructed on the second metal layer above the first metal layer. One complementary power line Vss is located between the second port bit line bar BLB2 and the second port bit line BL2, and another complementary power line Vss is located between the first port bit line BL1 and the first port bit line bar BLB1. The power line Vcc is located between the second port bit line BL2 and the first port bit line bar BLB1. The second port word line WL2 is located on the third metal layer above the second metal layer.

FIG. 3 illustrates a layout structure 300 of a dual port SRAM cell in accordance with another embodiment of the present invention. The layout structure 300 is similar to the layout structure 200 in FIG. 2A, except that a portion 306 of the second port word line WL2 overlaps a portion of the first port word line WL1, viewing from the top of the layout structure 300. As discussed above, there can be various orders for the vertical locations of the bit lines and word lines. For example, the bit lines BL1, BL2, BLB1, BLB2, power line Vcc, complementary power line Vss, and landing pads 302, 304 can be constructed on a metal layer lower than those on which the first port word line WL1 and the second port word line WL2 are constructed. As another example, the bit lines BL1, BL2, BLB1, BLB2, power line Vcc, complementary power line Vss, and landing pads 302, 304 can also be constructed on a metal layer between those on which the first port word line WL1 and the second port word line WL2 are constructed.

FIG. 4 illustrates a layout structure 400 of two neighboring dual port SRAM cells 402 and 404 in accordance with another embodiment of the present invention. As described above, the transistors of the cells 402 and 404 are constructed on a semiconductor substrate, which is not shown in this figure. The second port bit line bar BLB2, complementary power line Vss, second port bit line BL2, power line Vcc, first port bit line bar BLB1, complementary power line Vss, and first port bit line BL1 are constructed on the first metal layer, and extend across the areas where the cells 402 and 404 are located in. One complementary power line Vss is located between the second port bit line bar BLB2 and the second port bit line BL2, and another complementary power line Vss is located between the first port bit line BL1 and the first port bit line bar BLB1. The power line Vcc is located between the second port bit line BL2 and the first port bit line bar BLB1. The cell 402 contains landing pads 406 and 408 on the first metal layer, and the cell 404 contains landing pads 410 and 412 on the first metal layer.

A first port word line 414 and a second port word line 416 are constructed on a second metal layer in the cell 402. A first port word line 418 and a second port word line 420 are constructed on a third metal layer different from the second metal layer in the cell 404. In other words, the word lines 414 and 416 for the cell 402 and the word lines 418 and 420 for the cell 404 are located on different metal layers.

The bit lines, word lines for the cell 402, and word lines for the cell 404 can be arranged in various metal layers. For example, the metal layer for the bit lines can be lower than that for the word lines 414 and 416, which is further lower than that for the word lines 418 and 420. As another example, the metal layer for the bit lines and can be located between those for the word lines 414, 416 and for the word lines 418, 420.

The layout structures of cells 402 and 404 can be replicated for an entire memory cell array. As a result, the coupling effect of the memory cell array can be reduced. This helps improve the operation speed of the memory device.

Figure 5:
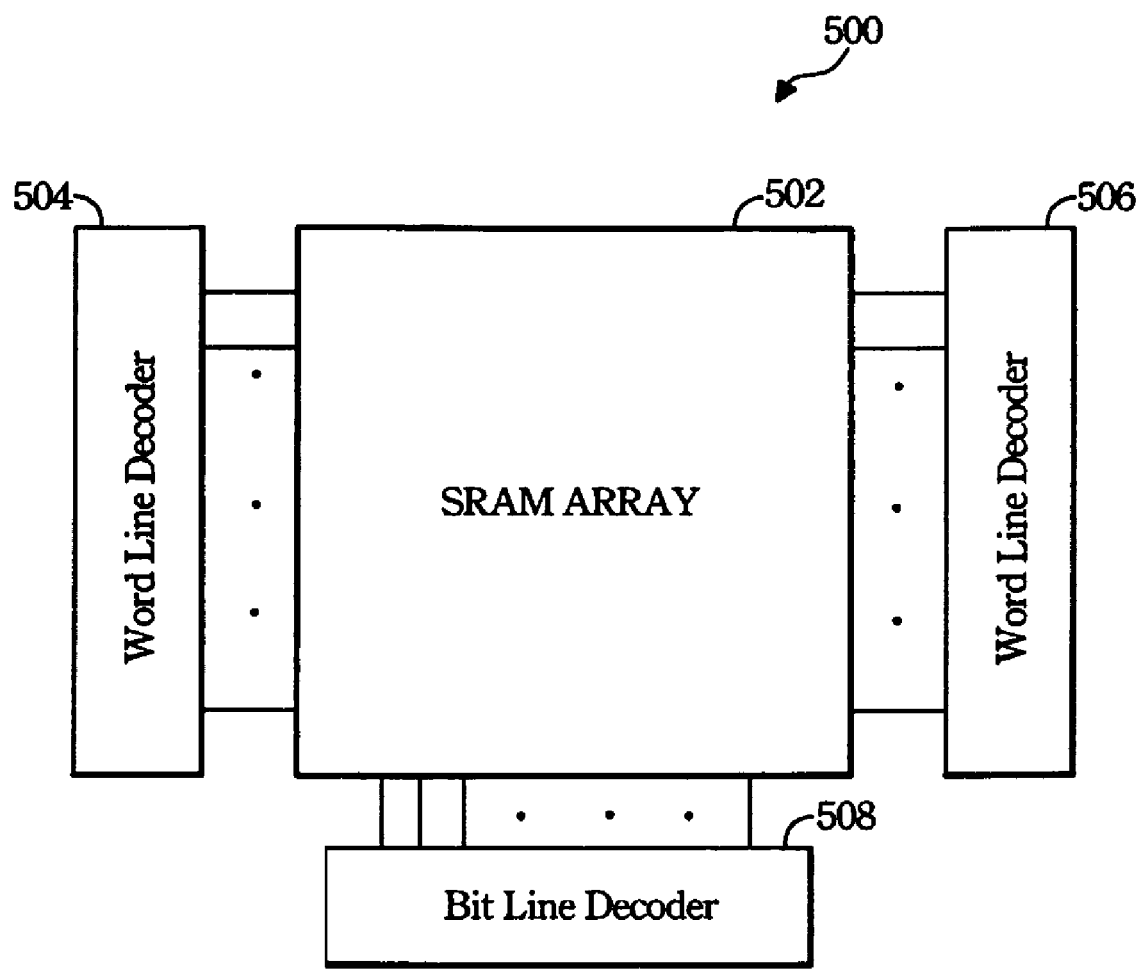
FIG. 5 illustrates a block diagram of an SRAM cell array coupled with a number of decoders in accordance with yet another embodiment of the present invention.

FIG. 5 illustrates a block diagram 500 of an SRAM cell array 502 coupled with a number of decoders 504, 506 and 508 in accordance with yet another embodiment of the present invention. The SRAM cell array 502 includes a plural of dual port SRAM cells, whose layout structures are designed according to the embodiments disclosed with reference to FIGS. 2A, 2B, 3 and 4. The cells are arranged in a matrix of rows and columns in the array 502. The first port word lines of the cells are coupled to a word line decoder 504 at the left side of the SRAM cell array 502. The second port word lines of the cells are coupled to the word line decoder 506 at the right side of the SRAM cell array 502. The bit lines and their complements of the cells are coupled to the bit line decoder 508 at the bottom of the SRAM cell array 502. The decoders 504, 506 and 508 can select a particular cell in the array 502 for read or write operation in response to an input signal. As descried above, the operation speed can be increased due to separate layers of word lines that helps reduce the coupling effect.

It is noted that although FIGS. 2A and 2B, 3 and 4 illustrate layout structures with only three metal layers, the invention can be applied to one with four or more metal layers, as long as the bit lines, first port word line, and second port word line are constructed on different metal layers. The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A memory device having a plurality of dual port static random access memory (SRAM) cells, each of which comprises:
at least one pair of cross-coupled inverters connected between a power line and complementary power line;
a first pass gate transistor connecting the cross-coupled inverters to a first bit line;
a second pass gate transistor connecting the cross-coupled inverters to a first complementary bit line;
a third pass gate transistor connecting the cross-coupled inverters to a second bit line;
a fourth pass gate transistor connecting the cross-coupled inverters to a second complementary bit line, wherein the first bit line, the first complementary bit line, the second bit line, and the second complementary bit line are located on a first metal layer in the memory device;
a first word line coupled to gates of the first and second pass gate transistors, located on a second metal layer in the memory device; and
a second word line coupled to gates of the third and fourth pass gate transistors, located on a third metal layer in the memory device, wherein the first, second and third metal layers are at different levels, and
wherein the second metal layer is higher than the first metal layer and the third metal layer is higher than the second metal layer.

2. The memory device of claim 1, wherein a portion of the first word line overlaps a portion of the second word line in a layout view of the memory device.

3. The memory device of claim 1, wherein the power line and the complementary power line are located on the first metal layer.

4. The memory device of claim 3, wherein the complementary power line is located between the first bit line and the first complementary bit line as well as between the second bit line and the second complementary bit line.

5. The memory device of claim 3, wherein the power line is located between the first complementary bit line and the second bit line.

6. The memory device of claim 1, wherein a length of the first bit line is shorter than one third of a length of the first word line.

7. The memory device of claim 1, further comprising:
at least one array of the dual port SRAM cells;
a first word line decoder adjacent to a boundary of the array for selecting the first word line; and
a second word line decoder adjacent to another boundary of the array for selecting the second word line.

8. A memory device having a plurality of dual port static random access memory (SRAM) cells, each of which comprises:
at least one pair of cross-coupled inverters connected between a power line and complementary power line;
a first pass gate transistor connecting the cross-coupled inverters to a first bit line;
a second pass gate transistor connecting the cross-coupled inverters to a first complementary bit line;
a third pass gate transistor connecting the cross-coupled inverters to a second bit line;
a fourth pass gate transistor connecting the cross-coupled inverters to a second complementary bit line, wherein the first bit line, the first complementary bit line, the second bit line, and the second complementary bit line are located on a first metal layer in the memory device;
a first word line coupled to gates of the first and second pass gate transistors, located on a second metal layer in the memory device; and
a second word line coupled to gates of the third and fourth pass gate transistors, located on a third metal layer in the memory device, wherein the first, second and third metal layers are at different levels, wherein the first metal layer is higher than the second metal layer, but lower than the third metal layer.

9. A memory device having a plurality of dual port static random access memory (SRAM) cells, comprising:
a first dual port SRAM cell constructed on a first area in the memory device;
a second dual port SRAM cell constructed on a second area neighboring the first area in the memory device;
a first bit line, a first complementary bit line, a second bit line and a second complementary bit line extending across the first and second areas, and located on a first metal layer in the memory device;
a first word line and a second word line located on a second metal layer in the first area; and
a third word line and a fourth word line located on a third metal layer in the second area, wherein the second metal layer is higher than the first metal layer, and the third metal layer is higher than the second metal layer.

10. The memory device of claim 9, further comprising a power line and a complementary power line extending across the first and second areas on the first metal layer.

11. The memory device of claim 10, wherein the complementary power line is located between the first bit line and the first complementary bit line as well as between the second bit line and the second complementary bit line.

12. The memory device of claim 10, wherein the power line is located between the first complementary bit line and the second bit line.

13. A memory device having a plurality of dual port static random access memory (SRAM) cells, comprising:
a first dual port SRAM cell constructed on a first area in the memory device;
a second dual port SRAM cell constructed on a second area neighboring the first area in the memory device;
a first bit line, a first complementary bit line, a second bit line and a second complementary bit line extending across the first and second areas, and located on a first metal layer in the memory device;
a first word line and a second word line located on a second metal layer in the first area; and
a third word line and a fourth word line located on a third metal layer in the second area, wherein the first metal layer is higher than the second metal layer, but lower than the third metal layer.

14. An integrated circuit having a plurality of dual port static random access memory (SRAM) cells, each of which comprises:
at least one pair of cross-coupled inverters connected between a power line and complementary power line, which are located on a first metal layer in the integrated circuit;
a first pass gate transistor connecting the cross-coupled inverters to a first bit line located on the first metal layer;
a second pass gate transistor connecting the cross-coupled inverters to a first complementary bit line located on the first metal layer;
a third pass gate transistor connecting the cross-coupled inverters to a second bit line located on the first metal layer;
a fourth pass gate transistor connecting the cross-coupled inverters to a second complementary bit line located on the first metal layer;

a first word line coupled to gates of the first and second pass gate transistors, located on a second metal layer in the integrated circuit; and a second word line coupled to gates of the third and fourth pass gate transistors, located on a third metal layer in the integrated circuit, wherein the power line is located between the first complementary bit line and the second bit line, wherein the complementary power line is located between the first bit line and the first complementary bit line as well as between the second bit line and the second complementary bit line, and wherein the second metal layer is higher than the first metal layer, and the third metal layer is higher than the second metal layer.

15. The integrated circuit of claim 14, wherein a portion of the first word line overlaps a portion of the second word line in a layout view of the integrated circuit.

16. An integrated circuit having a plurality of dual port static random access memory (SRAM) cells, each of which comprises:

at least one pair of cross-coupled inverters connected between a power line and complementary power line, which are located on a first metal layer in the integrated circuit;

a first pass gate transistor connecting the cross-coupled inverters to a first bit line located on the first metal layer;

a second pass gate transistor connecting the cross-coupled inverters to a first complementary bit line located on the first metal layer;

a third pass gate transistor connecting the cross-coupled inverters to a second bit line located on the first metal layer;

a fourth pass gate transistor connecting the cross-coupled inverters to a second complementary bit line located on the first metal layer;

a first word line coupled to gates of the first and second pass gate transistors, located on a second metal layer in the integrated circuit; and a second word line coupled to gates of the third and fourth pass gate transistors, located on a third metal layer in the integrated circuit, wherein the power line is located between the first complementary bit line and the second bit line, wherein the complementary power line is located between the first bit line and the first complementary bit line as well as between the second bit line and the second complementary bit line, wherein the first metal layer is higher than the second metal layer, but lower than the third metal layer.

* * * * *